United States Patent [19]

Havel

[11] Patent Number: 4,868,496

[45] Date of Patent: * Sep. 19, 1989

[54] VARIABLE COLOR COMPARISON OSCILLOSCOPE

[76] Inventor: Karel Havel, 15 Kensington Road, Apt. #704, Bramalea, ON, Canada, L6T 3W2

[*] Notice: The portion of the term of this patent subsequent to Mar. 14, 2006 has been disclaimed.

[21] Appl. No.: 206,099

[22] Filed: Jun. 13, 1988

Related U.S. Application Data

[63] Continuation-in-part of Ser. No. 946,036, Dec. 24, 1986, Pat. No. 4,812,744.

[51] Int. Cl.[4] .................. G01R 1/38; G01R 13/20; G09G 3/20
[52] U.S. Cl. ......................... 324/115; 324/121 R; 364/487; 340/753; 340/754
[58] Field of Search ............... 324/121 R, 115, 96, 324/103 P, 112; 340/722, 753, 754, 703; 364/487

[56] References Cited

U.S. PATENT DOCUMENTS

| | | | |
|---|---|---|---|
| 3,816,815 | 6/1974 | Schumann | 324/102 X |
| 4,114,095 | 9/1978 | Pankove et al. | 324/121 R X |
| 4,734,619 | 3/1988 | Havel | 340/703 X |
| 4,760,331 | 7/1988 | Komuro et al. | 324/121 R |
| 4,771,274 | 9/1988 | Havel | 340/703 X |

Primary Examiner—Reinhard J. Eisenzopf
Assistant Examiner—Vinh P. Nguyen

[57] ABSTRACT

A waveform measuring device includes a variable color display for exhibiting a measured waveform. The portions of the exhibited waveform that are within predetermined limits are illuminated in a first color, and the portions of the exhibited waveform that are outside the limits are illuminated in a second color.

8 Claims, 6 Drawing Sheets

VARIABLE COLOR COMPARISON OSCILLOSCOPE

CROSS-REFERENCE TO RELATED APPLICATIONS

This is a continuation-in-part of my copending application Ser. No. 06/946,036, filed on Dec. 24, 1986, entitled Variable Color Analog Voltmeter, now U.S. Pat. No. 4,812,744 issued on Mar. 14, 1989.

Reference is also made to my copending applications Ser. No. 06/856,196, filed on Apr. 28, 1986, entitled Multicolor Optical Device, abandoned, and Ser. No. 06/881,442, filed on July 2, 1986, entitled Multicolor Comparison Display, now U.S. Pat. No. 4,754,202 issued on June 18, 1988.

BACKGROUND OF THE INVENTION

1. Field of the Invention

This invention relates to measuring devices utilizing a variable color display.

2. Description of the Prior Art

A digital oscilloscope disclosed in U.S. Pat. No. 3,816,815, issued on June 11, 1974 to Robert W. Schumann, includes an A/D converter for converting a measured waveform to binary data which are stored in a memory and which may be utilized to reconstruct the waveform for displaying it on a monochromatic display.

A solid state oscilloscope disclosed in U.S. Pat. No. 4,114,095, issued on Sept. 12, 1978 to Jacques Isaac Pankove et al., includes an array of monochromatic light emitting diodes arranged in rows and columns. The columns of the array are continuously scanned, and measured voltage is applied to the rows to display the test waveform.

A variable color comparison oscilloscope is unknown.

SUMMARY OF THE INVENTION

The present invention endeavors to provide a measuring instrument capable of displaying the relationship between the amplitude of a measured signal and time.

It is another object of the invention to provide a waveform measuring instrument capable of simultaneously displaying the measured waveform and its relation to predetermined limits.

It is still another object of the invention to provide a variable color comparison oscilloscope.

It is further object of the invention to provide a variable color comparison memory oscilloscope.

In summary, a comparison oscilloscope of the invention includes a waveform measuring device and a variable color display for exhibiting the measured waveform. Color control is provided for illuminating in a first color the portions of the exhibited waveform that are within predetermined limits and in a second color the portions of the exhibited waveform that are outside the limits. Further objects of the invention will become obvious from the accompanying drawings and their description.

BRIEF DESCRIPTION OF THE DRAWINGS

In the drawings in which are shown the preferred embodiments of the invention,

FIG. 14b is a detail showing the relationship of an exemplary measured waveform to the measurement limits shown in FIG. 14a.

Throughout the drawings, like characters indicate like parts.

DESCRIPTION OF THE PREFERRED EMBODIMENTS

Figures 1A, 1B, 1C, 2, 4:
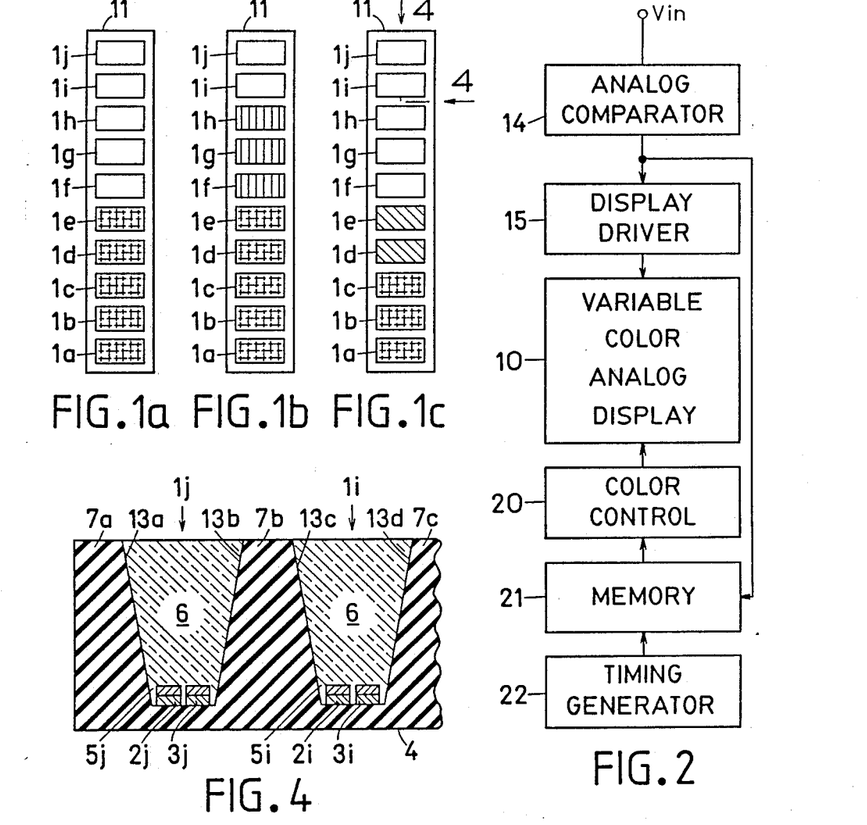
FIGS. 1a to 1c are examples of a variable color bar graph display on which instant measured values and their relations to a previous measured value are simultaneously exhibited.
FIG. 2 is block diagram of a variable color analog display voltmeter capable of indicating the relation of instant measured value to previous measured values.
FIG. 4 is a cross-sectional view, taken along the line 4—4 in FIG. 1c, revealing internal structure of a portion of a variable color bar graph display device.

Referring now, more particularly, to the drawings, FIGS. 1a to 1c are examples of a variable color bar graph display on which are shown three examples of instant measured values and their relations to a previous measured value. Considering the full scale to be 10 Volts, each display element in bar graph display 11 represents 1 Volt step. Thus display element 1a represents 1 Volt, display element 1b represents 2 Volts, display element 1c represents 3 Volts, etc. It would be obvious that the illustrated display may represent other scales of other quantities.

By referring to several illustrated examples, FIG. 1a simultaneously exhibits instant measured value 5 Volts by illuminating display elements 1a, 1b, 1c, 1d, and 1e in yellow color. The remaining display elements 1f, 1g, 1h, 1i, and 1j are extinguished. Yellow color of all illuminated display elements 1a to 1e indicates that the instant measured value is unchanged from the previously measured value.

FIG. 1b exhibits instant measured value 8 Volts by illuminating display elements 1a, 1b, 1c, 1d, and 1e in yellow color and display elements 1f, 1g, and 1h in red color. Yellow color of display elements 1a to 1e indicates that previously measured value was 5 Volts. Red color of display elements 1f to 1h indicates the increase in the measured value by 3 Volts.

FIG. 1c exhibits instant measured value 3 Volts by illuminating display elements 1a, 1b, and 1c in yellow color and display element 1d and 1e in green color. Yellow color of display elements 1a to 1c indicates that instant measured value is 3 Volts. Green color of display elements 1d and 1e measured value was 5 Volts (all display elements 1a to 1e).

In FIG. 2 is shown a block diagram of a variable color log voltmeter of the invention which includes an analog comparator 14, for comparing input signal Vin with reference values, and a display driver 15, for causing an analog indication of the value of the input signal to be exhibited on a variable color analog display 10, in a manner well understood by those skilled in the art. The invention resides in the addition of a memory 21, for storing from time to time measured values for later use, as determined by a timing generator 22, and color control 20, for controlling the color of the exhibited analog indication of the instant measured value in accordance with its relation to previous measured values. The analog voltmeter of the invention is thus capable of simultaneously exhibiting an instant measured value, by analog indication, and its relation to previous measured values, by color.

Figure 3:
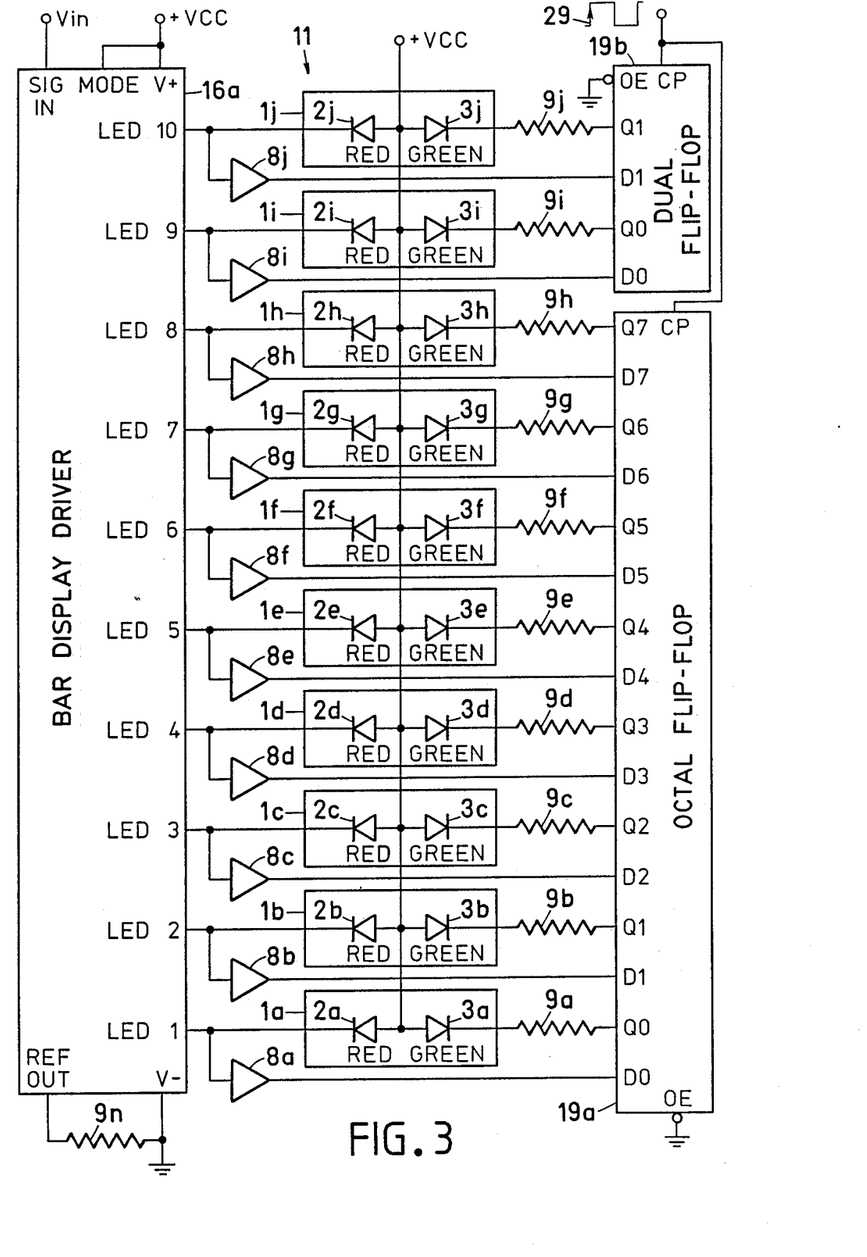
FIG. 3 is a simplified schematic diagram of a variable color bar graph voltmeter capable of indicating the relation of instant measured value to a previous measured value.

Proceeding now to the detailed description, in FIG. 3 is shown a simplified schematic diagram of a variable color bar graph voltmeter of the invention. The circuit employs a commercially available bar display driver 16a which contains a string of voltage comparators combined with a voltage reference network for detecting the level of an input signal Vin, applied to its input SIG IN, and for accordingly developing output drive signals to illuminate certain of display element 1a to 1j for providing a linear analog indication of the level of the input signal. The voltmeter operates in a bar mode, which is achieved by tying its MODE input to a high logic level. The value of resistor 9n coupled to reference output pin REF OUT determines the LED current and therefore the brightness of bar graph display 11. As will become more clear from the following description, the relation between the values of resistor 9n and resistors 9a to 9j determines the composite color of bar graph display 11.

Each display element 1a to 1j of bar graph display 11 includes a pair of closely adjacent LEDs (light emitting diodes): a red LED 2 and green LED 3 which are adapted for producing a composite light signal of a variable color. The cathodes of all red LEDs 2a, 2b, 2c, 2d, 2e, 2f, 2g, 2h, 2i, and 2j are respectively coupled to the outputs LED 1, LED 2, LED 3, LED 4, LED 5, LED 6, LED 7, LED 8, LED 9, and LED 10 of bar display driver 16a. The cathodes of all green LEDs 3a, 3b, 3c, 3d, 3e, 3f, 3g, 3h, 3i, and 3j are respectively coupled, via current limiting resistors 9a, 9b, 9c, 9d, 9e, 9f, 9g, and 9h, to the outputs Q0, Q1, Q2, Q3, Q4, Q5, Q6 and Q7 of an octal flip-flop 19a and, via current limiting resistors 9i and 9j, to the outputs Q0 and Q1 of a dual flip-flop 19b. The flip-flops 19a and 19b have their Output Enable inputs OE grounded for enabling the outputs Q0 to Q7. The anodes of all red LEDs 2a to 2j and all green LEDs 3a to 3j are commonly coupled to a power source +VCC. The data inputs D0 to D7 of octal flip-flop 19a and data inputs D0 and D1 of dual flip-flop 19b are respectively coupled, via non-inverting buffers 8a to 8j, for assuring correct logic levels, to outputs LED 1 to LED 10 of bar display driver 16a.

The operation of the analog voltmeter will be explained by three examples. EXAMPLE 1a considers previous measured value 5 Volts and instant measured value also 5 Volts. When previous measured value was 5 Volts, outputs LED 1, LED 2, LED 3, LED 4, and LED 5 of bar display driver 16a were at a low voltage level, thereby causing display elements 1a, 1b, 1c, 1d, and 1e to illuminate in red color, and the remaining outputs LED 6 to LED 10 were at a high voltage level, thereby causing display elements 1f, 1g, 1h, 1i, and 1j to extinguish. Low voltage levels at the outputs LED 1, LED 2, LED 3, LED 4, and LED are respectively applied, via buffers 8a, 8b, 8c, 8d, and 8e, to inputs D0, D1, D2, D3, and D4 of octal flip-flop 19a. When a leading edge of pulse 29 occurs, indicating the end of the previous measuring interval, the data at the inputs D0 to D7 are clocked into octal flip-flop 19a, into dual flip-flop 19b, and appear at respective outputs Q0 to Q7. As a result, the outputs Q0 to Q4 of octal flip-flop 19a drop to a low logic level, and the remaining outputs Q5 to Q7 of octal flip-flop 19a and outputs Q0 and Q1 of dual flip-flop 19b rise to a high logic level. The current flows from the source +VCC, via green LED 3a and resistor 9a to output Q0, via green LED 3b and resistor 9b to output Q1, via green LED 3c and resistor 9c to output Q2, via green LED 3d and resistor 9d to output Q3, and via green LED 3e and resistor 9e to output Q4. As a consequence, green LEDs 3a, 3b, 3c, 3d, and 3e illuminate and remain illuminated until different data are clocked into flip-flops 19a and 19b. The remaining green LEDs 3f to 3j are extinguished, because the remaining outputs Q5 to Q7 of octal flip-flop 19a and outputs Q0 and Q1 of dual flip-flop 19b are at a high logic level.

Considering the new measured value to be again 5 Volts, the outputs LED 1 to LED 5 of bar display driver 16a drop to a low voltage level, and the remaining outputs LED 6 to LED 10 rise to a high voltage level. As a consequence, red LEDs 2a, 2b, 2c, 2d, and 2e illuminate. As a result of internal blending, display elements 1a to 1e illuminate in substantially yellow color. The absence of red and green colors in bar graph display 11 indicates that the instant measured value is unchanged from the previously measured value, as viewed in FIG. 1a.

EXAMPLE 1b considers previous measured value 5 Volts and instant measured value 8 Volts. When the new measured value is 8 Volts, the outputs LED 1 to LED 8 of bar display driver 16a drop to a low voltage level, and the remaining outputs LED 9 and LED 10 rise to a high voltage level. As a consequence, red LEDs 2a, 2b, 2c, 2d, 2e, 2f, 2g, and 2h illuminate. As a result of internal blending, display elements 1a to 1e illuminate in substantially yellow color. The display elements 1f to 1h illuminate in red color. The presence of red color in bar graph display 11 indicates that the instant measured value is increased from the previously measured value, as viewed in FIG. 1b.

EXAMPLE 1c considers previous measured value 5 Volts and instant measured value 3 Volts. When the new measured value is 3 Volts, the outputs LED 1 to LED 3 of bar display driver 16a drop to a low voltage level, and the remaining outputs LED 4 to LED 10 rise to a high voltage level. As a consequence, red LEDs 2a, 2b, and 2c illuminate. as a result of internal blending, display elements 1a to 1c illuminate in substantially yellow color. The display elements 1d and 1e remain illuminated in green color. The presence of green color in bar graph display 11 indicates that the instant measured value is decreased from the previously measured value, as viewed in FIG. 1c.

An important consideration has been given to physical arrangement of the light emitting diodes in display elements 1a to 1j, as illustrated in FIG. 4. In display element 1j, red LED 2j and green LED 3j are disposed on a support 4 in a light blending cavity 5j and are completely surrounded by a transparent light scattering material 6. When forwardly biased, LEDs 2j and 3j emit light signals of red and green colors, respectively, which are blended by passing through light scattering material 6, acting to disperse the light signals, to form a composite light signal that emerges at the upper surface of display element 1j. The color of the composite light signal may be controlled by varying the portions of red and green light signals. In display element 1i, red LED 2i and green LED 3i are similarly disposed in a light blending cavity 5i and may be similarly activated.

The display elements 1j and 1i are optically separated from one another by opaque wall 7b. Although not shown, it will be appreciated that the remaining display elements are similarly optically separated. In display element 1j, opaque walls 7a and 7b have generally smooth inclined surfaces 13a and 13b defining an obtuse angle with support 4 and defining a light blending cavity 5j therebetween. In display element 1i, inclined surfaces 13c and 13d of opaque walls 7b and 7c similarly define a light blending cavity 5i therebetween. Although opaque walls 7 and light blending cavities 5 are shown to be of certain shapes and dimensions, it is envisioned that they may be modified and rearranged.

Figure 5:
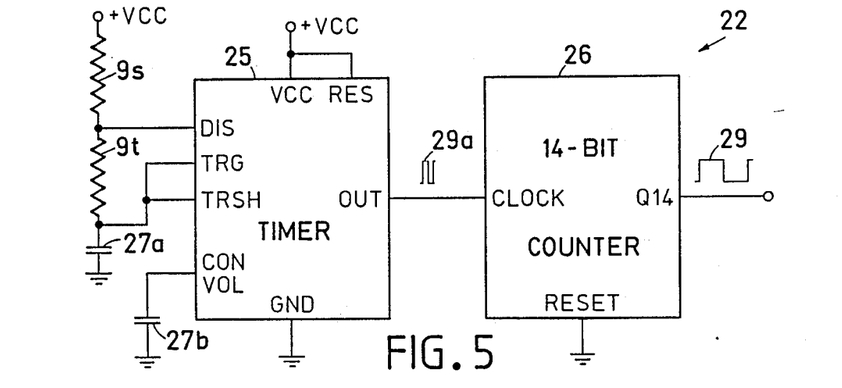
FIG. 5 is a schematic diagram of a timing generator.

FIG. 5 is a schematic diagram of timing generator 22 of FIG. 2 which includes a timer 25 operating in its astable mode for producing at its output OUT a train of pulses 29a of a relatively high frequency determined by the values of resistors 9s, 9t and capacitors 27a, 27b. The pulses 29a are applied to CLOCK input of a 14-bit counter 26 to divide their frequency by 16,384 and to provide at its output Q14 pulses 29 of a relatively low frequency. When considering an exemplary frequency of pulses 29a to be 1.63384 khz. the frequency of pulses 29 will be 0.1 Hz.

Figure 6A:
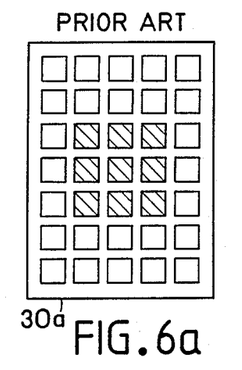
FIG. 6a is a plan view of a prior art monochromatic display on which an exemplary pattern in the form of a square is displayed.

In FIG. 6a is shown an exemplary display pattern in the shape of a square displayed in green color on a commercially well known 5×7 dot matrix monochromatic display 30a. Another display pattern in the shape of a cross is displayed in red color on a like monochromatic display 30b shown in FIG. 6b.

Figure 6B:
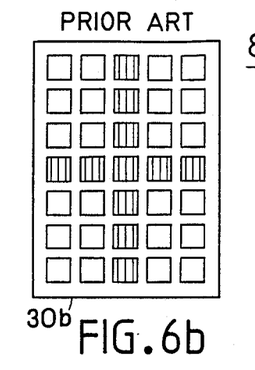
FIG. 6b is a plan view of a prior art monochromatic display on which an exemplary pattern in the form of a cross is displayed.
Figure 7:
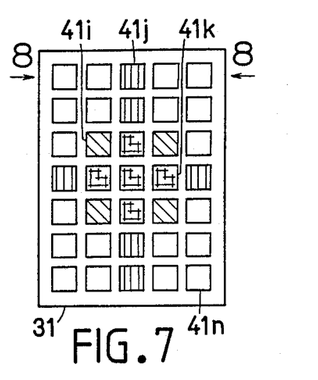
FIG. 7 is a plan view of a variable color display on which both previous patterns are simultaneously displayed in different colors.

As illustrated in FIG. 7, both previous display patterns may be simultaneously displayed on a single variable color display 31 similarly arranged in a 5×7 dot matrix. To facilitate the comparison, the two patterns are displayed according to the following system. The display areas that are illuminated only on display 30a, such as area 41i, are illuminated on display 31 in green color. The display areas that are illuminated only on display 30b, such as area 41j, are illuminated on display 31 in red color. The display areas that are illuminated on both displays 30a, 30b and that would therefore overlap, such as area 41k, are illuminated on display 31 in yellow color. The display areas that are extinguished on both displays 30a and 30b, such as area 41n, are also extinguished on display 31. It would be obvious that other color combinations may be devised.

Figure 8:
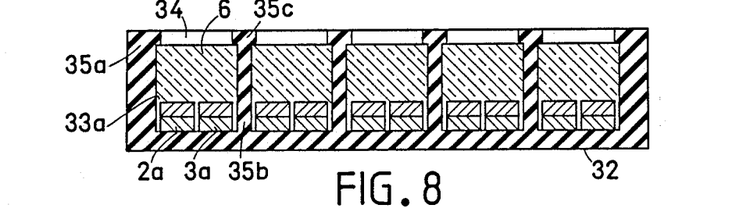
FIG. 8 is a cross-sectional view, taken along the line 8—8 in FIG. 7, revealing internal structure of one row of a variable color display.

An important consideration has been given to physical arrangement of the LEDs in the display areas, as illustrated in FIG. 8. The pairs of LEDs 2a and 3a, adapted for emitting light of red and green colors, respectively, are disposed in respective chambers 33 which are optically separated from one another by opaque walls 35. Although the chambers are shown to be of certain shapes and dimensions, it is envisioned that they may be modified and rearranged. In the exemplary chamber 33a, defined by walls 35a and 35b, LEDs 2a and 3a are mounted on a suitable support 32 and completely surrounded by light scattering material 6. When only one LED 2a or 3a is energized, by means of a circuit shown in FIG. 11, it emits light of either primary color through aperture 34 formed in top wall 35c. When both LEDs 2a and 3a are energized, light signals of red and green primary colors are blended, by passing through light scattering material 6, to form a composite light signal of substantially yellow color that emerges from aperture 34.

Figure 9:
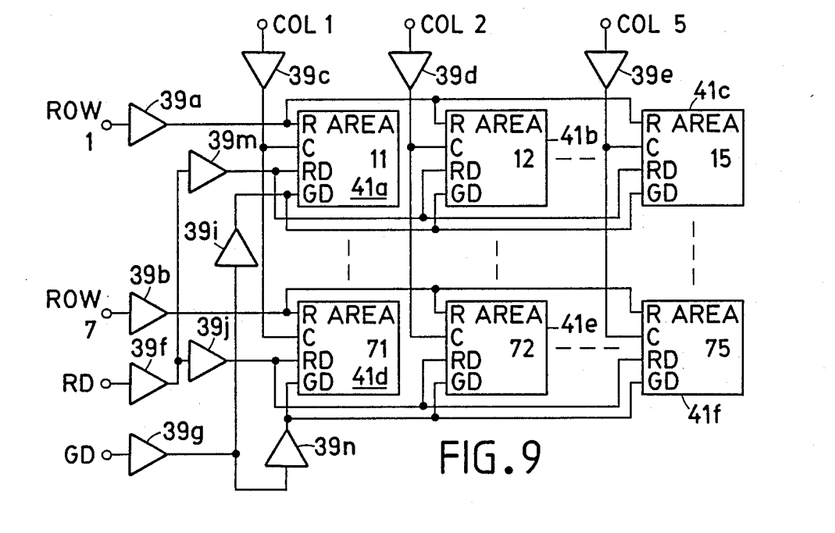
FIG. 9 is a block diagram of a matrix of variable color display areas arranged in rows and columns.

The matrix of variable color display areas arranged in rows and columns illustrated in FIG. 9 corresponds to variable color display 31 viewed in FIG. 7. A particular display area may be conveniently identified by its row and column numbers. By way of an example, display area 41b is located at row 1 and column 2. The display area 41f is located at row 7 and column 5. To facilitate the addressing, each display area has a Row input R, Column input C, Red Data input RD, and Green Data input GD, all adapted for accepting logic level signals. It is clearly evident from FIG. 9 that the Row inputs R of all display areas located in the same row are coupled. Similarly, the Column inputs C of all display areas located in the same column are coupled. The Red Data inputs RD of all display areas in the matrix are coupled. In a similar fashion, the Green Data inputs GD of all display areas are coupled. All display areas 41a to 41f may be extinguished by application of a suitable reset pulse, as will be revealed subsequently. To illuminate a desired portion in a desired display area, it is necessary to simultaneously activate the row input in which the area is located, the column input in which the area is located, and either of, or both, inputs RD, GD.

Figure 10:
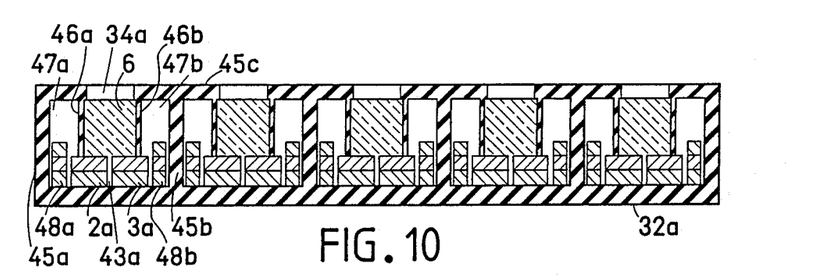
FIG. 10 is a cross-sectional view, similar to the view shown in FIG. 8, revealing internal structure of one row of variable color display with memory.

The variable color display illustrated in FIG. 10 includes five display elements disposed in chambers separated by respective walls 45. The exemplary display element located in chamber 43a, defined by walls 45a and 45b, includes two pairs of associated closely adjacent light emitting diodes and phototransistors 2a and 48a, 3a and 48b electrically coupled as in FIG. 12. The light emitting diodes 2a and 3a are adapted for emitting upon activation light signals of red and green colors, respectively. In a small chamber 47a, phototransistor 48a is completely surrounded by chamber walls 45a, 45c, and 46a, but its associated light emitting diode 2a is only partially disposed therein, being partially overlayed by opaque chamber wall 46a such that its one portion is located within small chamber 47a, and its remaining portion is located within chamber 43a. The vertically extending portion of chamber wall 46a abuts light emitting diode 2a and provides a hermetic seal therebetween so as to secure small chamber 47a from the presence of ambient light. The active area of phototransistor 48a is oriented to intercept light signals emitted from the portion of light emitting diode 2a within chamber 47a to exert a toggle effect by varying the resistance of phototransistor 48a in a sense tending to stabilize light emitting diode 2a either in its illuminated condition or in its extinguished condition. The phototransistor 48b is similarly completely disposed in small chamber 47b, and its associated light emitting diode 3a is partially disposed therein and partially disposed in chamber 43a, being divided by vertically extending wall 46b. The light signals emitted from the portions of light emitting diodes 2a and 3a that are located in chamber 43a are blended by passing through transparent light scattering material 6 to form a composite light signal. An aperture 34a is formed in top wall 45c such that the composite light signal may be viewed externally.

Figure 11:
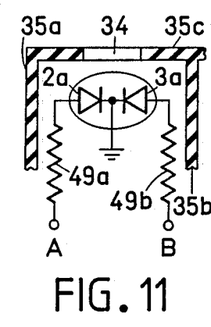
FIG. 11 is a schematic diagram showing the detail of one display element of FIG. 8.

In FIG. 11 ia shown a schematic diagram of one display element of FIG. 8 which includes red LED 2a, green LED 3a, and resistors 49a, 49b accommodated in a chamber defined by side walls of 35a, 35b and top wall 35c. When a positive voltage of suitable value is applied to the input A, current flows via current limiting resistor 49a, which confines the current flow, and LED 2a to ground, causing red LED 2a to illuminate and to maintain its illuminated condition as long as the voltage is present at the input A. In a similar fashion, a suitable positive voltage applied to the input B causes green LED 3a to illuminate. As was indicated earlier, light signals emitted by LEDs 2a and 3a are blended to form a composite light signal of substantially yellow color.

Figure 12:
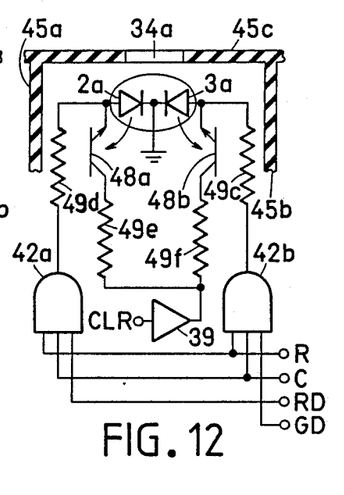
FIG. 12 is a schematic diagram showing the detail of one display element of FIG. 10.

The display element shown in FIG. 12 additionally includes AND gates 42a nd 42b, for gating signals R, C, RD, GD, and is capable of retaining the conditions of LEDs 2a and 3a after termination of the input signals. To reset the display element, a low logic level is momentarily applied to its Clear input CLR. As a consequence, the output of a preferably TTL (Transistor Transistor Logic) buffer 39 also drops to a low logic level. Since a TTL device is not capable of sourcing current from a low logic level output, no current can flow therefrom to ground. The LEDs 2a and 3a in all display elements therefore extinguish, and the resistances of phototransistors 48a and 48b in all elements rise to very high values. When a high logic level returns to the input CLR, the output of buffer 39 also rises to a high logic level. However, the currents flowing via resistor 49e, high resistance of phototransistor 48a and LED 2a to ground, and in parallel, via resistor 49f, high resistance of phototransistor 48b and LED 3a to ground, are very small and not sufficient to illuminate LEDs 2a and 3a. This state is therefore stable and will exist until the inputs R, C, RD, and GD are properly activated.

Figure 13A:
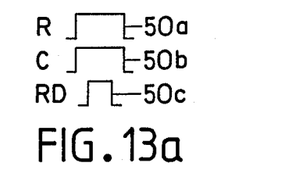
FIG. 13a is a timing diagram showing the relationship of signals for illuminating red LED in the selected display element.

The operation of the display element in FIG. 12 will be explained by examples of illuminating its either portion. Assuming that the exemplary display element 41b is located at the intersection of the row 1 and column 2 in FIG. 9 and by referring additionally to FIG. 13a, to illuminate red LED 2a, a positive going pulse 50a is applied to the input ROW 1, to activate via buffer 39a all Row inputs R in row 1, positive going pulse 50b is applied to the input COL 2, to activate via buffers 39 all Column inputs C in column 2, and positive going pulse 50c is applied to the input RD, to activate via buffers 39f, 39m, etc., RD inputs of all display elements. The width of pulse 50c depends on the response time of the phototransistor and should be sufficient to allow its resistance to drop below a predetermined triggering point. As a consequence, the output of AND gate 42a only in display element 41b rises momentarily to a high logic level, and current flows therefrom via resistor 49d and LED 2a to ground. The red LED 2a illuminates, and its emission causes the resistance of its associated phototransistor 48a to rapidly drop to a very low value. As a result of a positive optical feedback, whereby the increase in luminance of LED 2a causes the decrease in resistance of phototransistor 48a which in turn has an effect of further increase in the luminance and further decrease in the resistance, the current in the red LED branch, from buffer 39, via resistor 49e and phototransistor 48a, sharply rises to a value sufficient to maintain LED 2a fully illuminated. At the conclusion of pulse 50c, the magnitude of the LED current is limited substantially by the value of current limiting resistor 49e. It is readily apparent that this state is stable and will exist until another input of the display element is activated.

Figure 13B:
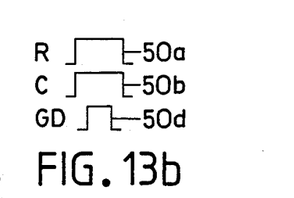
FIG. 13b is a timing diagram showing the relationship of signals for illuminating green LED in the selected display element.

Similarly, to illuminate green LED 3a in display element 41b, with reference to FIG. 13b, pulse 50a is applied to the input ROW 1, pulse 50b is applied to the input COL 2, and pulse 50d is applied to the input GD. As a consequence, the output of AND gate 42b only in display element 41b rises momentarily to a high logic level, and current flows therefrom via resistor 49c and LED 3a to ground, thereby causing green LED 3a to illuminate and to be stabilized in its illuminated condition by virtue of an optical feedback to its associated phototransistor 48b, until it is reset. When both red LED 2a and green LED 3a in the same display area are illuminated, the light signals of red and green colors are blended within the display area to form a composite light signal of substantially yellow color, as indicated previously.

When the output of buffer 39 is at a high logic level, the specific voltage therein may be within a wide voltage range. However, the voltage is the same for all LED branches connected thereto. Thus the accuracy of the ratio of currents in the LED branch pairs in each display element and resulting accuracy of the hue of composite light depend only on the matching of the current limiting resistors in each pair.

Two display patterns, each including a plurality of pattern elements corresponding to display areas of the variable color display 31, may be simultaneously displayed thereon. The display pattern in the form of a square shown in FIG. 6a may be illuminated on variable color display 31 in green color by activating GD inputs of all display areas located within the columns 2 to 4 and rows 3 to 5. The display pattern in the form of a cross shown in FIG. 6b may be illuminated on display 31 in red color by activating RD inputs of all display areas in the column 3 and all display areas in the row 4. It is readily apparent that all overlapping display areas will illuminate in yellow color due to blending of red and green colors therein. The two illuminated patterns may be now readily compared, as viewed in FIG. 7. The portions that appear only in the display pattern shown in FIG. 6a are illuminated in FIG. 7 in green color, the portions that appear only in the display pattern shown in FIG. 6b are illuminated in FIG. 7 in red color, and all overlapping portions are illuminated in FIG. 7 in yellow color. By comparing the size of the yellow area with combined sizes of the red and green areas in FIG. 7, the degree of similarity between the two display patterns may be similar are illuminated mostly in yellow color. The display patterns that are not similar are illuminated mostly in red and green colors.

It would be obvious to those skilled in the art that other types of light sensors, such are photodiodes, photodarlingtons, phototriacs, photo sensitive silicon controlled rectifiers, photodetectors, photoresistors, photoconductive cells, and the like, may be alternatively used in the preceding circuits.

Figure 14A:
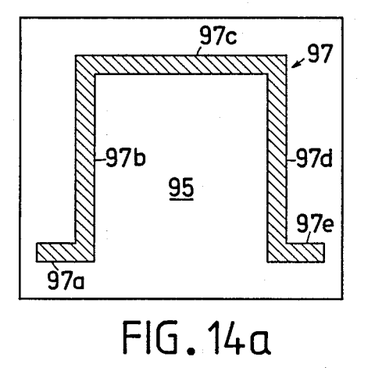
FIG. 14a is a detail showing measurement limits for an exemplary waveform.

In FIG. 14a is shown an oscilloscope display 95 on which exemplary limits 97 for a measured waveform in the shape of a square wave pulse are exhibited in green color. It will be appreciated that vertical deflection represents amplitude of measured signal, and horizontal deflection represents time, in a manner well understood by those skilled in the art. The limits 97 include start portion limits 97a, rising edge limits 97b, top portion limits 97c, falling edge limits 97d, and end portion limits 97e.

Figure 14B:
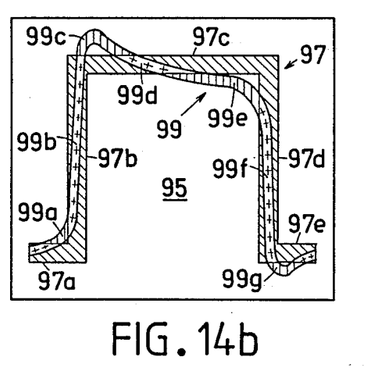

In FIG. 14b is shown a like oscilloscope display 95 on which an exemplary measured waveform 99, exhibited in red color, is superimposed on limits 97, exhibited in green color. The portions of measured waveform 99 that are not within limits 97 are exhibited in red color, and the portions of measured waveform 99 that are within limits 97 are exhibited, as a result of blending colors, in yellow color. More specifically, a rounded start portion 99a is exhibited in red color, to indicate that it is not within limits 97a, a rising edge portion 99b is exhibited in yellow color, to indicate that it is within limits 97b, an overshoot portion 99c is exhibited in red color, to indicate that it is not within limits 97c, a relatively short top portion 99d is exhibited in yellow color, to indicate that it is within limits 97c, a rounded portion 99e is exhibited in red color, to indicate that it is not within limits 97c, falling edge portion 99f is exhibited in yellow color, to indicate that it is within limits 97d, and an undershoot portion 99g is exhibited in red color, to indicate that it is not within limits 97e.

It is contemplated that the principles of the invention are also applicable to numerous diverse types of measuring devices, such are waveform analyzers, spectrum analyzers, network analyzers, logic analyzers, and the like.

Figure 15:
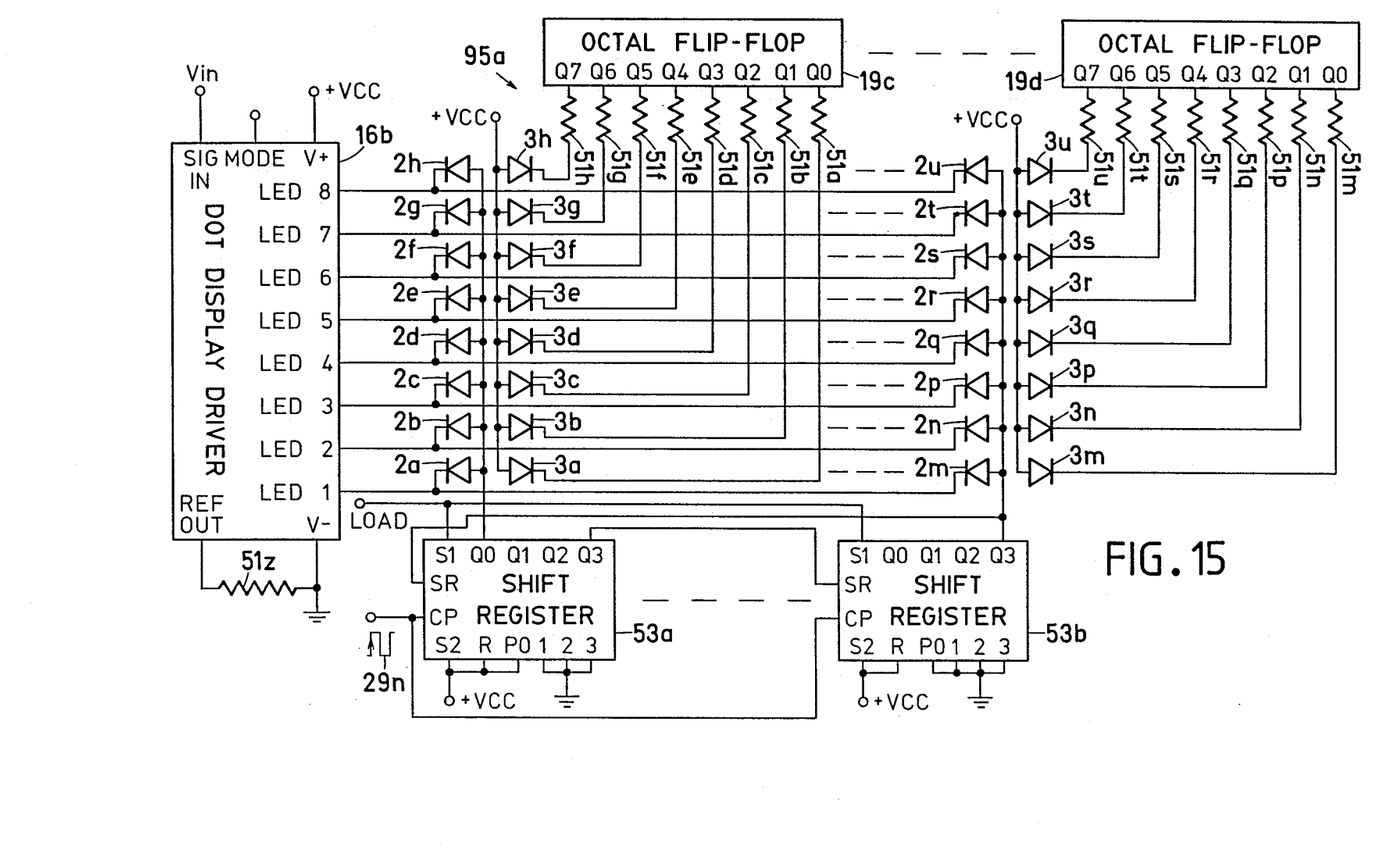
FIG. 15 is a simplified schematic diagram of a variable color comparison oscilloscope.

FIG. 15 is a simplified schematic diagram of a variable color comparison oscilloscope which includes pairs of red and green LEDs arranged in rows and columns. The outputs LED 1, LED 2, LED 3, LED 4, LED 5, LED 6, LED 7, and LED 8 of dot display driver 16b define 8 rows. The outputs Q0, Q1, Q2, and Q3 of shift register 53a and outputs Q0, Q1, Q2, and Q3 of shift register 53b define 8 columns, of which only the first and last columns are shown. Broken lines in FIG. 15 indicate that more display drivers, flip-flops, shift registers, and pairs of LEDs may be added to provide more accurate indication of the measured waveform. It would be obvious that other types of memories and scanning devices may be readily and effectively used.

The green LEDs 3a, 3b, 3c, 3d, 3e, 3f, 3g, and 3h are respectively connected, via current limiting resistors 51a, 51b, 51c, 51d, 51e, 51f, 51g, and 51h, to outputs Q0, Q1, Q2, Q3, Q4, Q5, Q6, and Q7 of octal flip-flop 19c. In a similar fashion, green LEDs 3m, 3n, 3p, 3q, 3r, 3s, 3t, and 3u are respectively connected, via current limiting resistors 51m, 51n, 51p, 51q, 51r, 51s, 51t, and 51u, to outputs Q0, Q1, Q2, Q3, Q4, Q5, Q6, and Q7 of octal flip-flop 19d. Data can be selectively written into octal flip-flops 19c and 19d exhibit predetermined measurement limits, such as exemplary limits 97 viewed in FIG. 14a, on oscilloscope display 95a by illuminating certain of green LEDs 3a to 3u corresponding by their positions to the limits. A low logic level stored in a particular flip-flop causes a green LED coupled to its output to illuminate, and a high logic level stored therein causes it to extinguish, as previously explained in the description of FIG. 3.

The oscilloscope display 95a is controlled by 4-bit shift registers 53a and 53b which are adapted for shifting data to the right by having the output Q3 of shift register 53a coupled Shift Right input SR of shift register 53b, by having the output Q3 of shift register 53b coupled to the input SR of shift register 53a, and by having their select inputs S2 coupled to a high logic level, in a manner well understood by those skilled in the art. The parallel inputs P0, P1, P2, and P3 of shift registers 53a and 53b are coupled to a low logic level, except for the least significant input P0 of shift register 53a which is coupled to a high logic level. When a short positive pulse LOAD is applied to the interconnected select inputs S1, the data from the parallel inputs P0, P1, P2, and P3 are loaded into shift registers 53a and 53b, appear at their outputs Q0, Q1, Q2, Q3, and may be serially delivered to the right with each active transition of clock pulses 29n of a sufficiently high frequency, when the inputs S1 are returned to a low logic level again. When the frequency of clock pulses 29n is synchronized with the frequency of a periodically occurring measured waveform, the columns of oscilloscope display 95a are progressively scanned in a cyclic sequence for causing the waveform exhibited on oscilloscope display 95a to be repeatedly refreshed.

When a high logic level appears at the output Q0 of shift register 53a, the column of red LEDs 2a, 2b, 2c, 2d, 2e, 2f, 2g, and 2h is enabled. When a high logic level appears at the output Q3 of shift register 53b, the column of red LEDs 2m, 2n, 2p, 2q, 2r, 2s, 2t, and 2u is enabled. When a high logic level appears at another output of shift register 53a or 53b, another column of red LEDs is enabled (not shown). Although not shown in the drawings, it would be obvious that circuits for scaling a measured waveform, synchronization, triggering, and the like, may be added to a variable color comparison oscilloscope of the present invention.

A dot display driver 16b, operating in its movable dot mode, which is achieved by leaving its MODE input open, measures input waveform Vin applied to its input SIG IN and develops, in accordance with the measured value of the input signal, a low voltage level at a single one of its outputs LED 1 to LED 8, which are respectively coupled to rows of red LEDs in oscilloscope display 95a. The value of resistor 51z determines the brightness of red LEDs 2a to 2u.

Considering as an example the measured value of the input waveform to be about 1 Volt at the time when the first column of oscilloscope display 95a is enabled, the output LED 1 of dot display driver 16b drops to a low voltage level, and current flows from the output Q0 of shift register 53a via red LED 2a to the output LED 1 of dot display driver 16b, causing red LED 2a to illuminate. When the measured value of the input signal is about 5 Volts at the time when the last column of oscilloscope display 95a is enabled, current flows from the output Q3 of shift register 53b via red LED 2r to the output LED 5 of dot display driver 16b, causing red LED 2r to illuminate. It is obvious that a curve corresponding to the measured waveform will appear on oscilloscope display 95a when the input waveform is periodically applied to the input Vin. The portions of the exhibited waveform that are not within the measurement limits will illuminate in red color, and portions of the exhibited waveform that are within the limits, displayed in green color, will illuminate, due to internal blending in each pair of LEDs, as shown in FIGS. 4 and 8, in yellow color.

Prior art oscilloscopes have a problem in requiring either that the measured waveform be applied periodically to the measuring input, or that the waveform reconstructed from a memory be repeatedly refreshed on the oscilloscope display. It is one of the objects of the present invention to solve such a problem by providing a new type of a memory oscilloscope.

Figures 16, 17:
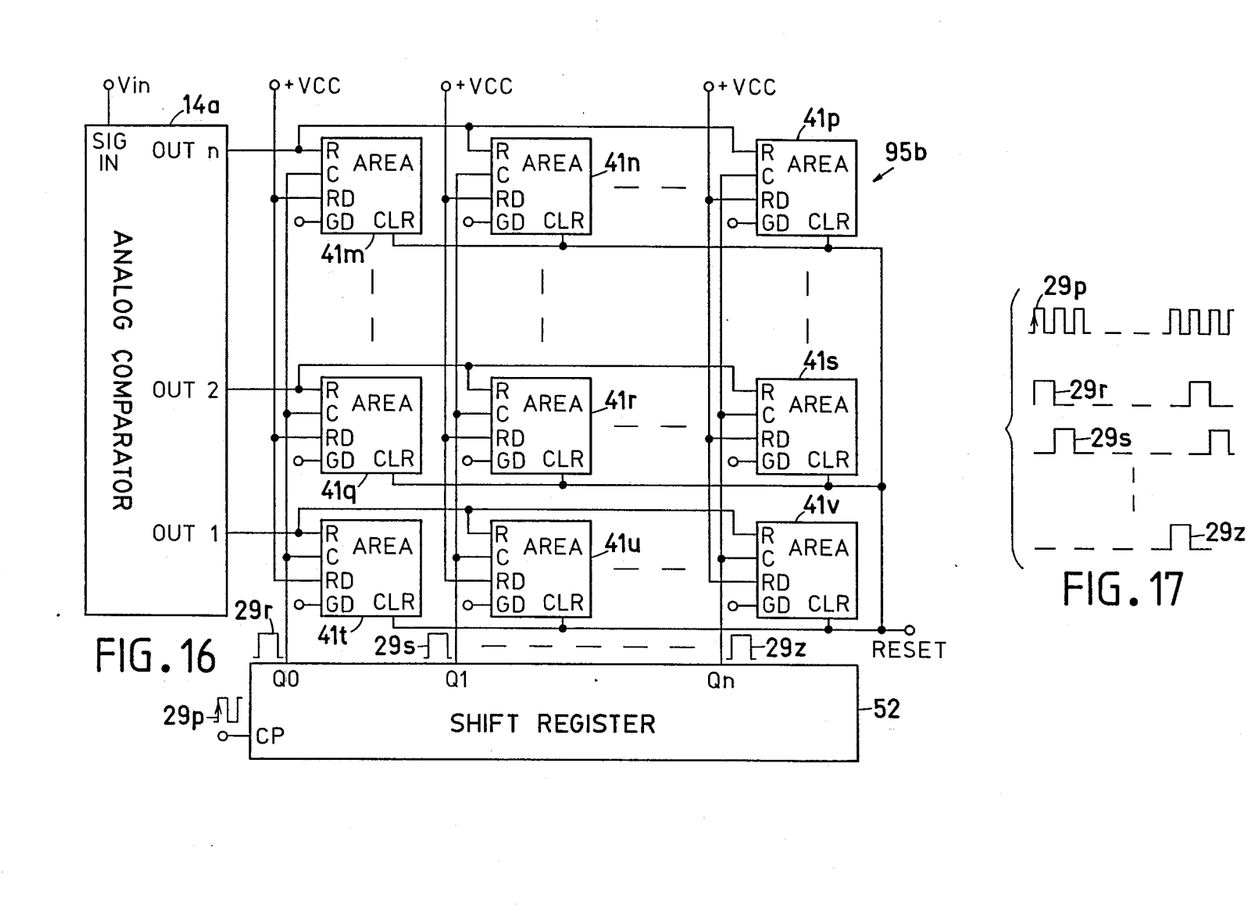
FIG. 16 is a simplified schematic diagram of a variable color comparison memory oscilloscope.
FIG. 17 is a timing diagram of the variable color comparison memory oscilloscope of FIG. 16.

FIG. 16 is a simplified schematic diagram of a variable color comparison memory oscilloscope with an oscilloscope display 95b, including a large number of display areas 41m to 41v arranged in rows and columns, which is capable of retaining and continuously displaying a single measured waveform, without the need for repeated refreshing. Row inputs R of display areas 41m to 41v are respectively coupled in the rows, Column inputs C of display areas 41m to 41v are respectively coupled in the columns, and Red Data inputs RD of all display areas 41m to 41v are coupled to a voltage source +VCC. The description of the circuit should considered together with its associated timing diagram viewed in FIG. 17.

The Clear inputs CLR of all display areas 41m to 41v are commonly coupled to a RESET input which is operative to cause the entire oscilloscope display 95b to be initialized upon application of a relatively short negative pulse. During the measurement, the RESET input must be maintained at a high logic level (not shown).

The limits for a measured waveform my be displayed on oscilloscope display 95b in green color by activating Green Data inputs GD, Row inputs R, and Column inputs C of certain of the display areas 41m to 41v that correspond by their positions to the limits, while maintaining Red Data inputs RD of all display areas 41m to 41v at a low logic level (not shown). The activated display areas will briefly illuminate in green color and will be stabilized in their illuminated condition in a manner indicated earlier. The Green Data inputs GD of all display areas 41m to 41v must be maintained during subsequent measurements at a low logic level (not shown).

The oscilloscope display 95b is scanned in a cyclic sequence by shift register 52 which is adapted for shifting a single positive pulse to the right with each active transition of clock pulses 29p, to enable the columns of oscilloscope display 95b one at a time. When a positive pulse 29r appears at the output Q0 of shift register 52, the Column inputs C of display areas 41t, 41q to 41m are enabled by a high logic level. When a positive pulse 29s appears at the output Q1 of shift register 52, the Column inputs C of display areas 41u, 41r to 41n are enabled. When a positive pulse 29z appears at the output Qn of shift register 52, the Column inputs C of display areas 41v, 41s to 41p are enabled.

An analog comparator 14a, which may include an analog to digital converter, measures input waveform Vin applied to its input SIG In and develops, in accordance with the measured value of the input signal, a high voltage level at a single one of its outputs OUT 1, OUT 2 to OUT n, which represent measurement units and which are respectively coupled to rows of display areas 41m to 41v in oscilloscope display 95b.

Considering as an example the measured value of the input waveform to be 1 measurement unit at the time when the first column of oscilloscope display 95b is enabled, the output OUT 1 of analog comparator 14a rises to a high logic level to activate row of display areas 41t, 41u to 41v. Since at that moment only display area 41t has its Column input C at a high logic level, it briefly illuminates in red color and will be stabilized in its illuminated condition in a manner previously pointed out.

When the measured value of the input signal is 2 measurement units at the time when the second column of oscilloscope display 95b is enabled, the output OUT 2 of analog comparator 14a rises to a high logic level to activate row of display areas 41q, 41r to 41s. Since at that moment only display area 41r has its Column input C at a high logic level, it briefly illuminates in red color and will be stabilized in its illuminated condition.

It is obvious that a curve corresponding to the measured waveform will appear on oscilloscope display 95b when the measurement is completed and will be retained and continuously displayed thereon until it is reset. The portions of the exhibited waveform that are not within the measurement limits will illuminate in red color, and portions of the exhibited waveform that are within the limits, displayed in green color on certain of display areas 41m to 41v, will illuminate, due to internal blending in respective display areas, in yellow color.

The invention may be now briefly summarized. The method was disclosed of simultaneously exhibiting a measured waveform and its relation to predetermined limits, on a single variable color display, by causing the measured waveform to be exhibited on the display, and by controlling the color of the exhibited waveform such that its portions that are within the limits are illuminated in a first color, and its portions that are outside the limits are illuminated in a second color.

A comparison oscilloscope was disclosed that comprises a waveform measuring device, a variable color display for exhibiting the measured waveform, and color control for controlling the color of the exhibited waveform in accordance with its relation to predetermined limits such that the portions of the measured waveform that are within the limits are illuminated in a first color, and the portions of the measured waveform that are outside the limits are illuminated in a second color. A memory oscilloscope was disclosed which includes a display with a plurality of variable color display areas capable of stabilizing their illuminated conditions such that they maintain their colors.

It would be obvious that numerous modifications can be made in the construction of the preferred embodiments shown herein, without departing from the spirit and scope of the invention as defined in the appended claims. It is contemplated that the principles of the invention may be also applied to numerous diverse types of display devices, such are crt tubes, liquid crystal devices, plasma devices, and the like.

CORRELATION TABLE
This is a correlation table of reference characters, their descriptions, and examples of commercially available parts.

| # | DESCRIPTION | EXAMPLE |
|---|---|---|
| 1 | display element | |
| 2 | red LED | |
| 3 | green LED | |
| 4 | support | |
| 5 | light blending cavity | |
| 6 | light scattering material | |
| 7 | opaque wall | |
| 8 | non-inverting buffer | 4050 |
| 9 | resistor | |
| 10 | variable color analog display | |
| 11 | variable color bar graph display | |
| 13 | inclined surface of wall | |
| 14 | analog comparator | |
| 15 | display driver | |
| 16 | bar/dot display driver | LM3914 |
| 19 | octal flip-flop | 74F374 |
| 20 | color control | |
| 21 | memory | |
| 22 | timing device | |
| 25 | timer | NE555 |
| 26 | 14-bit counter | 4020 |
| 27 | capacitor | |
| 29 | pulse | |
| 30 | monochromatic 5 × 7 matrix display | |
| 31 | variable color 5 × 7 matrix display | |
| 32 | support | |
| 33 | chamber for light emitting diodes | |
| 34 | aperture | |
| 35 | opaque wall | |
| 39 | buffer | 74LS244 |
| 41 | display area | |
| 42 | 3-input AND gate | 74HC11 |
| 43 | chamber for light emitting diodes | |
| 45 | opaque wall | |
| 46 | opaque chamber wall | |
| 47 | small chamber | |
| 48 | phototransistor | |
| 49 | resistor | |
| 50 | pulse | |
| 51 | resistor | |
| 52 | shift register | |
| 53 | 4-bit shift register | 74HC194 |
| 95 | oscilloscope display | |
| 97 | limits for measured waveform | |
| 99 | measured waveform | |

What I claim is:

1. A method of simultaneously displaying a measured waveform and its relation to predetermined limits, on a single variable color display means, by causing said waveform to be exhibited on said display means, and by controlling the color of the exhibited waveform in accordance with its relation to said limits such that portions of the exhibited waveform that are within said limits are displayed in a first color, and portions of the exhibited waveform that are outside said limits are displayed in a second color.

2. A measuring device comprising:
waveform measuring means having outputs indicative of the measured waveform;
variable color display means responsive to said outputs for exhibiting said measured waveform; and
color control means for controlling the color of the exhibited waveform in accordance with its relation to predetermined limits such that portions of the exhibited waveform that are within said limits are illuminated in a first color, and portions of the exhibited waveform that are outside said limits are illuminated in a second color.

3. A method of simultaneously displaying a measured waveform, predetermined limits, and the relation of said waveform to said limits, on a single variable color display means, by causing said limits to be exhibited on said display means in a first color, by causing said waveform to be exhibited on said display means, and by controlling the color of the exhibited waveform in accordance with its relation to said limits such that portions of the exhibited waveform that are within said limits are displayed in a second color, and portions of the exhibited waveform that are outside said limits are displayed in a third color.

4. A measuring device comprising:
waveform measuring means having outputs indicative of the measured waveform;
variable color display means responsive to said outputs for exhibiting said measured waveform;
means for exhibiting predetermined limits on said display means in a first color; and
color control means for controlling the color of the exhibited waveform in accordance with its relation to said limits such that portions of the exhibited waveform that are within said limits are illuminated in a second color, and portions of the exhibited waveform that are outside said limits are illuminated in a third color.

5. A method of simultaneously displaying a measured waveform and its relation to predetermined limits, on a single display means including a plurality of variable color display areas arranged in a pattern, by briefly illuminating certain of said display areas that correspond by their positions to said measured waveform, by controlling the color of the exhibited waveform in accordance with its relation to said limits such that the display areas corresponding to portions of the exhibited waveform that are within said limits are illuminated in a first color and the display areas corresponding to portions of the exhibited waveform that are outside said limits are illuminated in a second color, and by stabilizing the illuminated display areas such that they maintain their colors.

6. A measuring device comprising:
waveform measuring means having outputs indicative of the measured waveform;
display means including a plurality of variable color display areas arranged in a pattern and responsive to said outputs for exhibiting said measured waveform by briefly illuminating certain of said display areas that correspond by their positions to said measured waveform;
color control means for controlling the color of the exhibited waveform in accordance with its relation to predetermined limits such that the display areas corresponding to portions of the exhibited waveform that are within said limits are illuminated in a first color, and the display areas corresponding to portions of the exhibited waveform that are outside said limits are illuminated in a second color; and
means for stabilizing the illuminated display areas such that they maintain their colors.

7. A method of simultaneously displaying a measured waveform, predetermined limits, and the relation of said waveform to said limits, on a single display means including a plurality of variable color display areas arranged in a pattern, by briefly illuminating in a first color certain of said display areas that correspond by their positions to said limits, by briefly illuminating certain of said display areas that correspond by their positions to said measured waveform, by controlling the color of the exhibited waveform in accordance with its relation to said limits such that the display areas corresponding to portions of the exhibited waveform that are within said limits are illuminated in a second color and the display areas corresponding to portions of the exhibited waveform that are outside said limits are illuminated in a third color, and by stabilizing the illuminated display areas such that they maintain their colors.

8. A measuring device comprising:

waveform measuring means having outputs indicative of the measured waveform;

display means including a plurality of variable color display areas arranged in a pattern and responsive to said outputs for exhibiting said measured waveform by briefly illuminating certain of said display areas that correspond by their positions to said measured waveform;

means for exhibiting predetermined limits on said display means by briefly illuminating in a first color certain of said display areas that correspond by their positions to said limits;

color control means for controlling the color of the exhibited waveform in accordance with its relation to said limits such that the display areas corresponding to portions of the exhibited waveform that are within said limits are illuminated in a second color, and the display areas corresponding to portions of the exhibited waveform that are outside said limits are illuminated in a third color; and means for stabilizing the illuminated display areas such that they maintain their colors.

* * * * *